United States Patent
Lee et al.

(10) Patent No.: US 12,406,720 B2
(45) Date of Patent: Sep. 2, 2025

(54) MEMORY STRUCTURE, MANUFACTURING METHOD THEREOF, AND OPERATING METHOD THEREOF

(71) Applicant: MACRONIX INTERNATIONAL CO., LTD., Hsinchu (TW)

(72) Inventors: Feng-Min Lee, Hsinchu (TW); Po-Hao Tseng, Taichung (TW); Yu-Yu Lin, New Taipei (TW); Yu-Hsuan Lin, Taichung (TW); Wei-Fu Wang, Keelung (TW); Wei-Lun Weng, Tainan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 161 days.

(21) Appl. No.: 18/391,880

(22) Filed: Dec. 21, 2023

(65) Prior Publication Data
US 2025/0210100 A1 Jun. 26, 2025

(51) Int. Cl.
G11C 11/4096 (2006.01)
G11C 11/4094 (2006.01)
H10B 12/00 (2023.01)

(52) U.S. Cl.
CPC ...... *G11C 11/4096* (2013.01); *G11C 11/4094* (2013.01); *H10B 12/05* (2023.02); *H10B 12/482* (2023.02)

(58) Field of Classification Search
CPC . G11C 11/4096; G11C 11/4094; H10B 12/05; H10B 12/482; H10B 41/27
(Continued)

(56) References Cited

U.S. PATENT DOCUMENTS 11,894,368 B2 2/2024 Naskar et al.
11,908,856 B2 2/2024 Guha et al.
(Continued)

FOREIGN PATENT DOCUMENTS

TW 202125825 A 7/2021
TW 202125831 A 7/2021
(Continued)

OTHER PUBLICATIONS

Hideo Sunami, "The Role of the Trench Capacitor in DRAM Innovation", Technical Literature, IEEE Solid-State Circuits Newsletter, pp. 42-44. (ref. 01, file attached).

*Primary Examiner* — Michael T Tran
(74) *Attorney, Agent, or Firm* — McClure, Qualey & Rodack, LLP

(57) ABSTRACT

A memory structure includes insulating layers, gate layers, a first doping layer, channel layers, a columnar channel, second doping layers, a first dielectric layer, second dielectric layers, a third dielectric layer, and fourth dielectric layers. The first doping layer and the columnar channel penetrate through the insulating layers and the gate layers that are alternately stacked. The channel layers are connected to the first doping layer, in which the channel layers and the insulating layers are alternately stacked. The second doping layers surround the columnar channel and are connected to the channel layers. The first dielectric layer is between the first doping layer and the gate layers. The second dielectric layers are between the second doping layers and the gate layers. The third dielectric layer is between the columnar channel and the second doping layers. The fourth dielectric layers are between the channel layers and the gate layers.

20 Claims, 19 Drawing Sheets

(58) Field of Classification Search
USPC ...................................... 365/185.24, 189.011
See application file for complete search history.

(56) References Cited

U.S. PATENT DOCUMENTS

| | | | |
|---|---|---|---|
| 12,058,858 | B2 | 8/2024 | Zhang et al. |
| 2018/0277560 | A1* | 9/2018 | Zushi .................. H10D 62/115 |
| 2018/0366554 | A1* | 12/2018 | Choi .................... H10D 64/685 |
| 2019/0325964 | A1 | 10/2019 | Harari |
| 2020/0035703 | A1 | 1/2020 | Harari |
| 2020/0395341 | A1* | 12/2020 | Maejima ................ H01L 24/08 |
| 2022/0108993 | A1* | 4/2022 | Wang .................... H10B 43/35 |
| 2022/0130853 | A1* | 4/2022 | Sharangpani ........... H01L 25/50 |
| 2022/0173120 | A1* | 6/2022 | Lee ........................ H10B 43/40 |
| 2022/0246520 | A1* | 8/2022 | Zhu .................... H10D 84/0186 |
| 2022/0285391 | A1* | 9/2022 | Yamabe ................ H10B 43/10 |
| 2022/0416052 | A1* | 12/2022 | Kang ................. H10D 30/6743 |
| 2023/0197855 | A1 | 6/2023 | Hasan et al. |
| 2023/0328986 | A1 | 10/2023 | Kwon et al. |
| 2023/0368843 | A1 | 11/2023 | Harari |
| 2023/0413522 | A1 | 12/2023 | Park et al. |

FOREIGN PATENT DOCUMENTS

| | | |
|---|---|---|
| TW | 202220177 A | 5/2022 |
| TW | 202341471 A | 10/2023 |
| TW | 202347742 A | 12/2023 |
| TW | 202349757 A | 12/2023 |

\* cited by examiner

MEMORY STRUCTURE, MANUFACTURING METHOD THEREOF, AND OPERATING METHOD THEREOF

BACKGROUND

Field of Invention

The present disclosure relates to a memory structure, a manufacturing method of the memory structure, and an operating method of the memory structure.

Description of Related Art

Dynamic random access memories (DRAMs) are widely used because of their advantages of high density, low cost, and low power dissipation. However, as memory technology is approaching its physical limits, conventional DRAMs (e.g., DRAMs with one transistor and one capacitor (1T1C)) are facing a number of serious challenges in their development. For example, the DRAM size is not easily miniaturized, DRAM processes are becoming more complex, and the capacitor aspect ratio increases dramatically with size reduction. In view of the above, there is a need to provide a new dynamic random access memory and its manufacturing method to overcome the above problems.

SUMMARY

The present disclosure provides a memory structure including a plurality of insulating layers, a plurality of gate layers, a first doping layer, a plurality of channel layers, a columnar channel, a plurality of second doping layers, a third doping layer, a fourth doping layer, a first dielectric layer, a plurality of second dielectric layers, a third dielectric layer, and a plurality of fourth dielectric layers. The insulating layers and the gate layers are alternately stacked. The first doping layer penetrates through the insulating layers and the gate layers. The channel layers are respectively connected to the first doping layer, in which the channel layers and the insulating layers are alternately stacked. The columnar channel penetrates through the insulating layers and the gate layers. The second doping layers respectively surround the columnar channel, in which the second doping layers are respectively connected to the channel layers. The third doping layer is coupled to the columnar channel. The fourth doping layer is coupled to the columnar channel. The first dielectric layer is disposed between the first doping layer and the gate layers. The second dielectric layers are respectively disposed between the second doping layers and the gate layers. The third dielectric layer is disposed between the columnar channel and the second doping layers. The fourth dielectric layers are respectively disposed between the channel layers and the gate layers.

In some embodiments, the memory structure further includes a write bit-line disposed on the first doping layer.

In some embodiments, the third doping layer is disposed under the columnar channel, and the fourth doping layer is disposed on the columnar channel.

In some embodiments, the memory structure further includes a read bit-line disposed on the fourth doping layer.

In some embodiments, the first doping layer and the second doping layers have a first conductive type, the third doping layer and the fourth doping layer have a second conductive type, and the first conductive type is different from the second conductive type.

In some embodiments, the first conductive type is N-type, and the second conductive type is P-type.

In some embodiments, the first conductive type is P-type, and the second conductive type is N-type.

In some embodiments, the channel layers have the second conductive type, and the columnar channel has the first conductive type.

In some embodiments, the first conductive type is N-type, and the second conductive type is P-type.

In some embodiments, the channel layers and the columnar channel are undoped.

The present disclosure provides a manufacturing method of a memory structure that includes the following operations. A first hole is formed to penetrate through a plurality of insulating layers and a plurality of first gate layers that are alternately stacked. A first dielectric layer is formed to cover a sidewall of the first hole. A first doping layer is formed in the first hole. A second hole is formed to penetrate through the insulating layers and the first gate layers. The first gate layers exposed from the second hole are partially removed to form a plurality of recess portions. A plurality of second dielectric layers is formed in the plurality of recess portions. A plurality of second doping layers is formed to cover the second dielectric layers. A third dielectric layer is formed in the second hole to cover the insulating layers and the second doping layers. A columnar channel is formed in the second hole. The first dielectric layer, the first gate layers, and the second dielectric layers between the first doping layer and the second doping layers are removed to form a plurality of trenches. A plurality of channel layers is formed in the trenches to connect to the first doping layer and the second doping layers.

In some embodiments, after forming the columnar channel in the second hole, the channel layers are formed to connect to the first doping layer and the second doping layers.

In some embodiments, the manufacturing method of the memory structure further includes after forming the channel layers in the trenches, forming a plurality of fourth dielectric layers adjacent to the channel layers; and forming a plurality of second gate layers adjacent to the fourth dielectric layers.

In some embodiments, the manufacturing method of the memory structure further includes before forming the second hole penetrating through the insulating layers and the first gate layers, forming a third doping layer in a substrate, and forming the insulating layers and the first gate layers on the substrate, in which the second hole exposes the third doping layer; and doping a top portion of the columnar channel to form a fourth doping layer.

In some embodiments, the manufacturing method of the memory structure further includes forming a write bit-line on the first doping layer; and forming a read bit-line on the fourth doping layer.

The present disclosure provides an operating method of a memory structure that includes the following operations. The memory structure of any one of embodiments mentioned previously is received, in which the gate layers, the first doping layer, the channel layers, and the second doping layers form a plurality of write transistors, and the gate layers, the second doping layers, the third doping layer, the fourth doping layer, and the columnar channel form a plurality of read transistors. A writing operation is performed, and the writing operation includes: applying a first voltage to a selected gate of the gate layers of the write transistors, in which the first voltage is greater than a threshold voltage of the selected gate; and applying a second voltage to the first doping layer of the write transistors to charge or not charge one of the second doping layers corresponding to the selected gate, in which the second voltage is a positive voltage or 0V.

In some embodiments, the write transistors are N-type transistors, and the read transistors are P-type transistors.

In some embodiments, the operating method of the memory structure further includes performing a reading operation. The reading operation includes applying a third voltage to the selected gate, in which the third voltage is 0V or less than the threshold voltage of the selected gate; applying a plurality of fourth voltages to unselected gates of the gate layers of the write transistors, in which the fourth voltages are negative voltages; and applying a fifth voltage to the third doping layer, in which the fifth voltage is a positive voltage.

In some embodiments, the write transistors are P-type transistors, and the read transistors are N-type transistors.

In some embodiments, the operating method of the memory structure further includes performing a reading operation. The reading operation includes applying a third voltage to the selected gate, in which the third voltage is 0V or less than the threshold voltage of the selected gate; applying a plurality of fourth voltages to unselected gates of the gate layers of the write transistors, in which the fourth voltages are positive voltages; and applying a fifth voltage to the third doping layer, in which the fifth voltage is a positive voltage.

BRIEF DESCRIPTION OF THE DRAWINGS

The present disclosure can be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

It will be understood that, although the terms, first, second, third etc. may be used herein to describe various elements, components, regions, layers, and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Further, it should be understood that when an element A is referred to as being "connected to" or "coupled to" an element B, the element A can be directly connected to the element B or indirectly connected to the element B (e.g., an intervening element C (and/or other elements) may be positioned between the element A and the element B).

The present disclosure provides a memory structure, which is a Three dimensional (3D) dynamic random access memory (DRAM) structure. The memory structure includes a plurality of memory cells, and each memory cell includes a write transistor and a read transistor to form a 2T0C DRAM structure. The memory structure of the present disclosure has high-density memory cells, so it is beneficial to the size reduction of the memory structure. Moreover, the process of manufacturing the memory structure is simple, so the manufacturing cost can be reduced, thereby replacing a traditional 1T1C DRAM structure.

Figure 1:
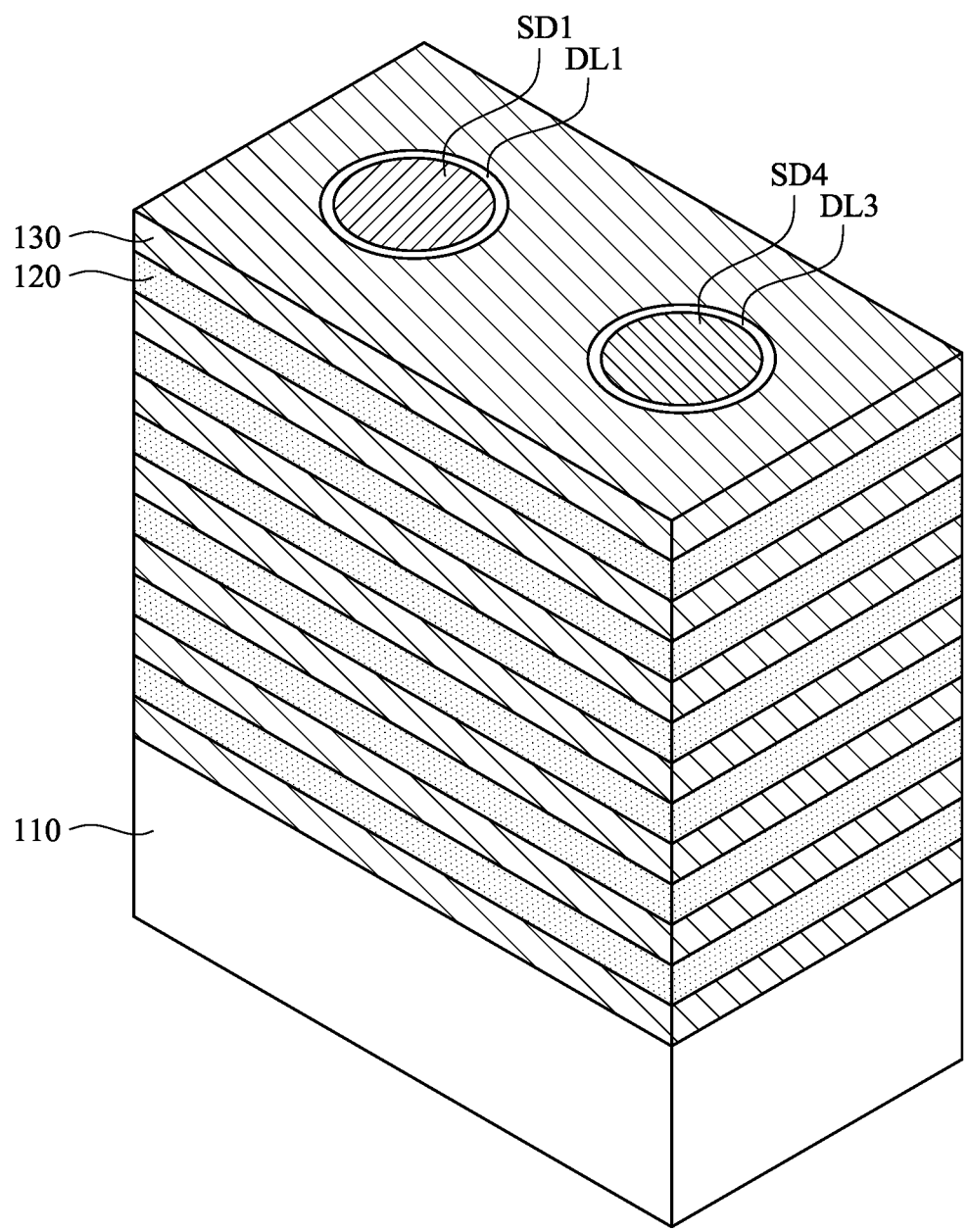
FIG. 1 is a three-dimensional schematic diagram of a memory structure according to various embodiments of the present disclosure.
Figure 2:
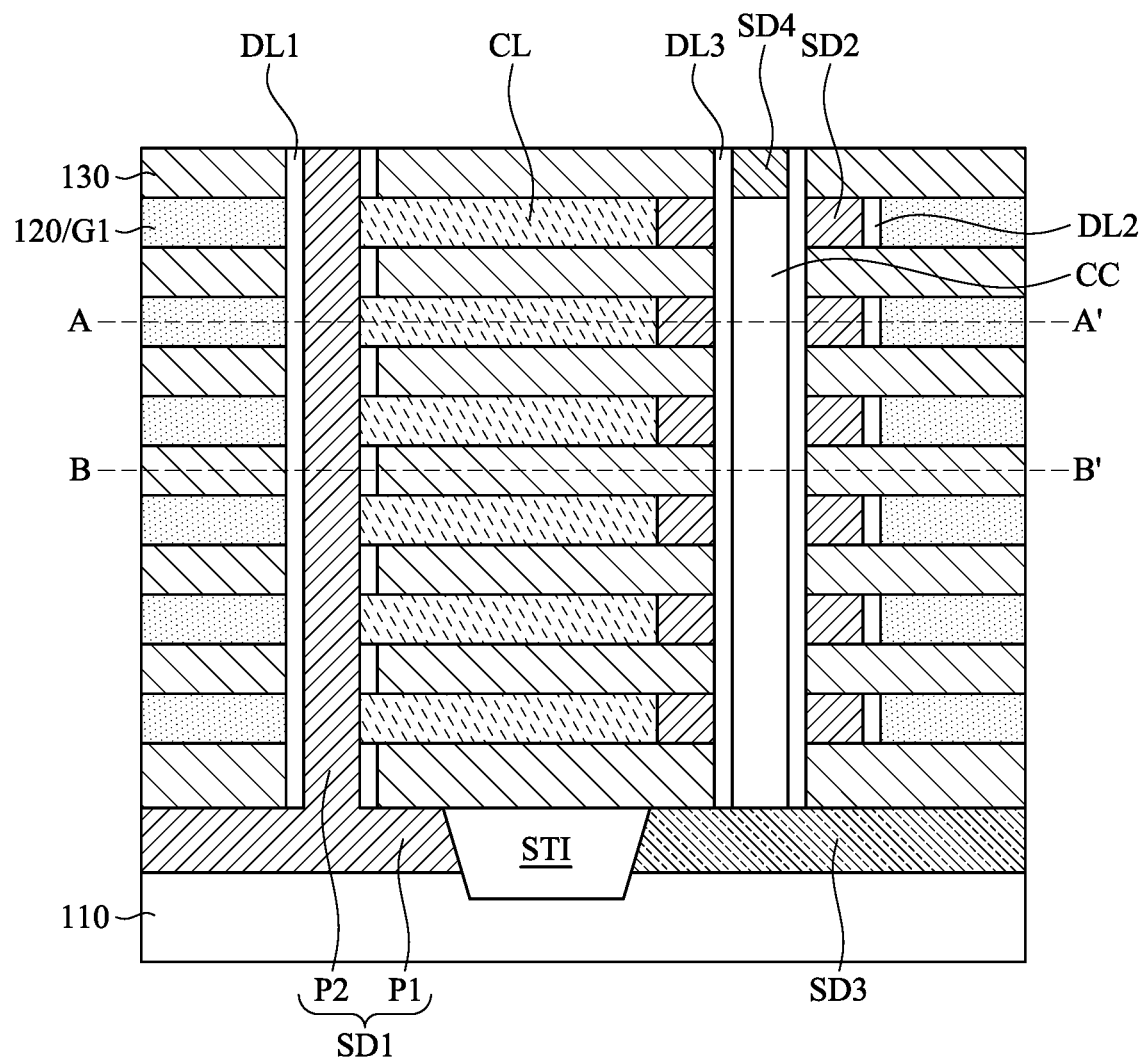
FIG. 2 is a schematic cross-sectional view of a memory structure according to various embodiments of the present disclosure.
Figure 3:
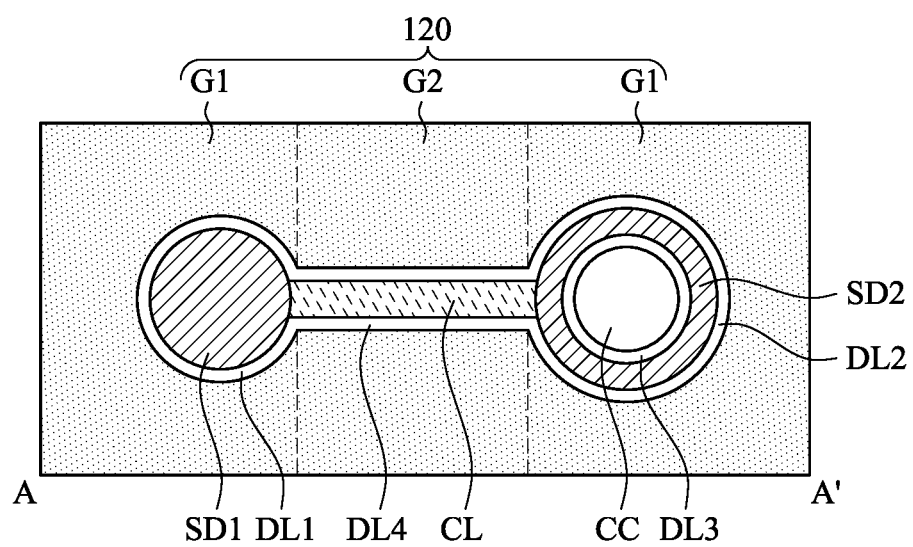
FIG. 3 is a schematic cross-sectional view along the section line A-A' of FIG. 2.
Figure 4:
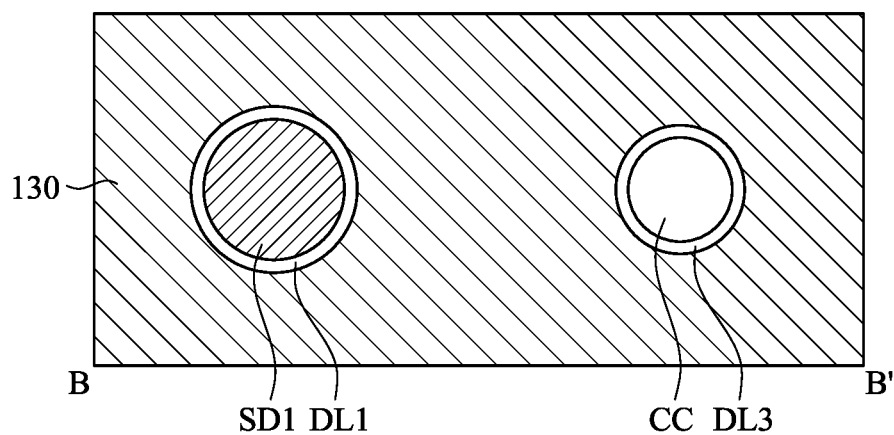
FIG. 4 is a schematic cross-sectional view along the section line B-B' of FIG. 2.

FIG. 1 is a three-dimensional schematic diagram of a memory structure according to various embodiments of the present disclosure. FIG. 2 is a schematic cross-sectional view of a memory structure according to various embodiments of the present disclosure. FIG. 3 is a schematic cross-sectional view along the section line A-A' of FIG. 2. FIG. 4 is a schematic cross-sectional view along the section line B-B' of FIG. 2. As shown in FIG. 1 to FIG. 4, the memory structure 100 includes a substrate 110, an isolation structure STI, a plurality of gate layers 120, a plurality of insulating layers 130, a first doping layer SD1, a plurality of second doping layers SD2, a plurality of channel layers CL, a third doping layer SD3, fourth doping layer SD4, a columnar channel CC, a first dielectric layer DL1, a plurality of second dielectric layers DL2, a third dielectric layer DL3, and a plurality of fourth dielectric layers DL4.

In some embodiments, the substrate 110 is a semiconductor substrate. In some embodiments, the substrate 110 includes any suitable semiconductor materials and/or semiconductor materials used to form semiconductor structures. These semiconductor materials include, for example, one or more materials, such as crystalline silicon, silicon oxide, strained silicon, silicon germanium, doped or undoped polysilicon, doped or undoped silicon wafers, germanium, gallium arsenide, other suitable semiconductor materials, or combinations thereof. In some embodiments, the substrate 110 is a silicon substrate. In some embodiments, the gate layers 120 include metallic conductive materials, non-metallic conductive materials, or combinations thereof, such as tungsten, copper, aluminum, gold, silver, other suitable metals, metal alloys, polysilicon, or combinations thereof. In some embodiments, the insulating layers 130 include oxides, nitrides, or combinations thereof, such as silicon dioxide, silicon nitride, or combinations thereof. In some embodiments, the isolation structure STI is a shallow trench isolation (STI).

Please refer to FIG. 1 and FIG. 2 at the same time. The insulating layers 130 and the gate layers 120 are alternately stacked, and the amounts of the insulating layer 130 and the gate layer 120 can be adjusted arbitrarily, which are not limited thereto. The first doping layer SD1 penetrates through the insulating layers 130 and the gate layers 120. The channel layers CL are respectively connected to the first doping layer SD1, in which the channel layers CL and the insulating layers 130 are alternately stacked. The columnar channel CC penetrates through the insulating layers 130 and the gate layers 120. As shown in FIG. 2 and FIG. 3, the second doping layers SD2 respectively surround the columnar channel CC, and the second doping layers SD2 are respectively connected to the channel layers CL. Therefore, the gate layers 120, the first doping layer SD1, the channel layers CL, and the second doping layers SD2 form a plurality of write transistors. The gate layers 120 may also be referred to as control gates. As shown in FIG. 2, the first doping layer SD1 includes a first portion P1 and a second portion P2 that are connected with each other, in which the first portion P1 penetrates through the insulating layers 130 and the gate layers 120, and the second portion P2 is positioned in the substrate 110. As shown in FIG. 3, each gate layer 120 includes first gate layers G1 and second gate layers G2. The first gate layers G1 surround the first doping layer SD1, the second doping layers SD2, and the columnar channel CC. The second gate layers G2 are positioned on both sides of the channel layers CL. In some embodiments, the first doping layer SD1 is a source electrode, and the second doping layers SD2 are drain electrodes. In some other embodiments, the first doping layer SD1 is a drain electrode, and the second doping layers SD2 are source electrodes.

Please continue to refer to FIG. 2 and FIG. 3. The third doping layer SD3 is coupled to the columnar channel CC, and the fourth doping layer SD4 is coupled to the columnar channel CC. In some embodiments, as shown in FIG. 2, the third doping layer SD3 is disposed under columnar channel CC, and the fourth doping layer SD4 is disposed on the columnar channel CC, but the disposition is not limited thereto. In some embodiments, the third doping layer SD3 is a source electrode, and the fourth doping layer SD4 is a drain electrode. In some other embodiments, the third doping layer SD3 is a drain electrode, and the fourth doping layer SD4 is a source electrode. The gate layers 120, the second doping layers SD2, the third doping layer SD3, the fourth doping layer SD4, and the columnar CC form a plurality of read transistors. As shown in FIG. 2, these read transistors are vertically interconnected. As shown in FIG. 3, the columnar channel CC of the read transistors is surrounded by the second doping layers SD2 and the gate layers 120, and the second doping layers SD2 and gate layers 120 serve as the gates of the read transistors. The second doping layers SD2 are ring-shaped. A writing operation can be performed by applying a gate voltage to one write transistor, and applying a voltage or not applying a voltage to the first doping layer SD1, so that the corresponding second doping layer SD2 surrounding the columnar channel CC has a high potential or a low potential. In this way, data 1 or data 0 is written into the read transistor. The second doping layers SD2 can store charges and be chargeable or dischargeable. The potential of the second doping layers SD2 can be adjusted by charging or discharging the second doping layers SD2. The second doping layers SD2 may also be called storage nodes (SNs), floating gates (FGs), or gate nodes. The operating method of the memory structure will be further illustrated with a circuit diagram later.

As shown in FIG. 2 to FIG. 4, the first dielectric layer DL1 is disposed between the first doping layer SD1 and the gate layers 120 and between the first doping layer SD1 and the insulating layers 130, so the gate layers 120 are electrically isolated from the first doping layer SD1. The second dielectric layers DL2 are respectively disposed between the second doping layers SD2 and the gate layers 120, so the gate layers 120 are electrically isolated from the second doping layers SD2. The third dielectric layer DL3 is disposed between the columnar channel CC and the second doping layers SD2 and between the columnar channel CC and the insulating layers 130, so the columnar channel CC is electrically isolated from the second doping layers SD2. The third dielectric layer DL3 is ring-shaped. The fourth dielectric layers DL4 are respectively disposed between the channel layers CL and the gate layers 120, so the gate layers 120 are electrically isolated from the channel layers CL. Please refer to FIG. 1 and FIG. 2 again. In some embodiments, the third dielectric layer DL3 is disposed between the fourth doping layer SD4 and one of the insulating layers 130. In some embodiments, the first dielectric layer DL1, the second dielectric layers DL2, the third dielectric layer DL3, and the fourth dielectric layer DL4 respectively include gate oxides. In some embodiments, the first dielectric layer DL1, the second dielectric layers DL2, the third dielectric layer DL3, and the fourth dielectric layers DL4 respectively include silicon dioxide, silicon nitride, silicon oxynitride, aluminum oxide, hafnium oxide, zirconium oxide, titanium oxide, tantalum oxide, other suitable high dielectric constant (high-k) dielectric materials, or combinations thereof.

Please refer to FIG. 2 and FIG. 3 again. In some embodiments, the first doping layer SD1 and the second doping layers SD2 have a first conductive type, and the third doping layer SD3 and the fourth doping layer SD4 have a second conductive type, in which the first conductive type is different from the second conductive type. In some embodiments, the first conductive type is N-type, and the second conductive type is P-type. The write transistors including the first doping layer SD1 and the second doping layers SD2 are N-type transistors, such as N-type metal-oxide-semiconductor field-effect transistors (NMOSFETs). The read transistors including the third doping layer SD3 and the fourth doping layer SD4 are P-type transistors, such as P-type metal-oxide-semiconductor field-effect transistors (PMOSFETs). In some embodiments, the channel layers CL have the second conductive type, and the columnar channel CC has the first conductive type. In other embodiments, the channel layers CL and the columnar channel CC are undoped. In some embodiments, the first doping layer SD1 and the second doping layers SD2 are N+ doped regions, the channel layers CL are P-doped regions or undoped silicon layers, the third doping layer SD3 and the fourth doping layer SD4 are P+ doped regions, and columnar channel CC is an N-doped region.

In other embodiments, the first conductive type is P-type, and the second conductive type is N-type. The write transistors including the first doping layer SD1 and the second doping layers SD2 are P-type transistors, such as PMOSFETs, and the read transistors including the third doping layer SD3 and the fourth doping layer SD4 are N-type transistors, such as NMOSFETs. In some embodiments, the channel layers CL have the second conductive type, and the columnar channel CC has first conductive type. In some embodiments, the channel layers CL and the columnar channel CC are undoped.

In some embodiments, the materials of the channel layers CL and the columnar channel CC respectively include silicon, germanium, polysilicon, semiconductor oxides (such as indium oxide ($In_2O_3$), indium gallium zinc oxide (IGZO), indium tin oxide (ITO)), or other suitable III-V materials.

Figure 5A:
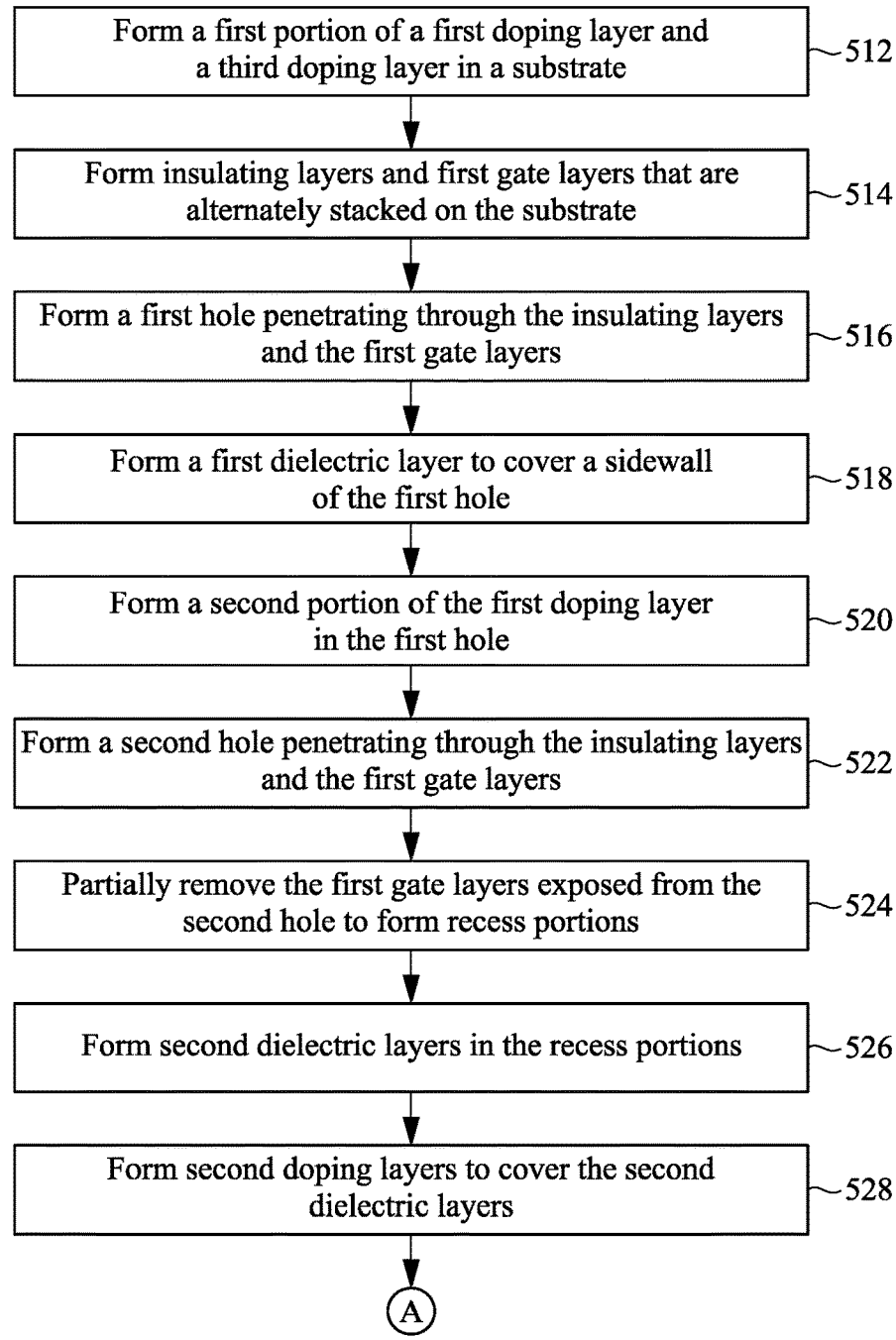
FIG. 5A and FIG. 5B are flowcharts of a manufacturing method of a memory structure according to various embodiments of the present disclosure.
Figure 5B:
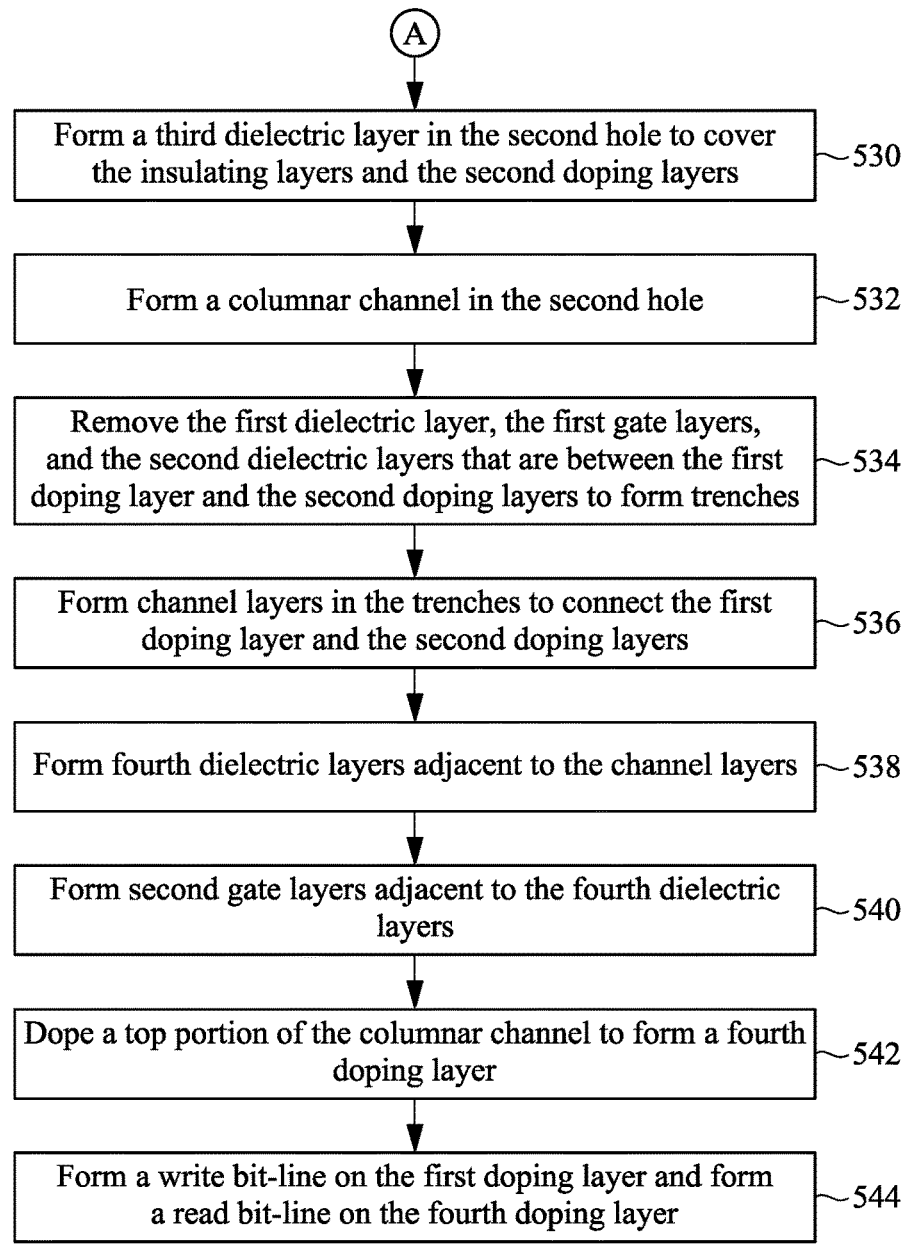

The present disclosure provides a manufacturing method of a memory structure. Please refer to FIG. 3 and FIG. 5A to FIG. 6I. FIG. 5A and FIG. 5B are flowcharts of a manufacturing method 500 of a memory structure according to various embodiments of the present disclosure. The manufacturing method 500 includes operation 512, operation 514, operation 516, operation 518, operation 520, operation 522, operation 524, operation 526, operation 528, operation 530, operation 532, operation 534, operation 536, operation 538, operation 540, operation 542, and operation 544. FIG. 6A to FIG. 6I are schematic cross-sectional views of intermediate stages of manufacturing a memory structure according to various embodiments of the present disclosure. The above-mentioned operations 512 to 544 will be described later with FIG. 6A to FIG. 6I and FIG. 3. Although a series of operations or steps are used below to describe the method disclosed herein, an order of these operations or steps should not be construed as a limitation to the present disclosure. For example, some operations or steps may be performed in a different order, and/or other steps may be performed at the same time. In addition, it is not necessary to perform all of the operations, steps, and/or features shown to achieve the embodiments of the present disclosure. In addition, each operation or step described herein may contain several sub-steps or actions.

Figure 6A:
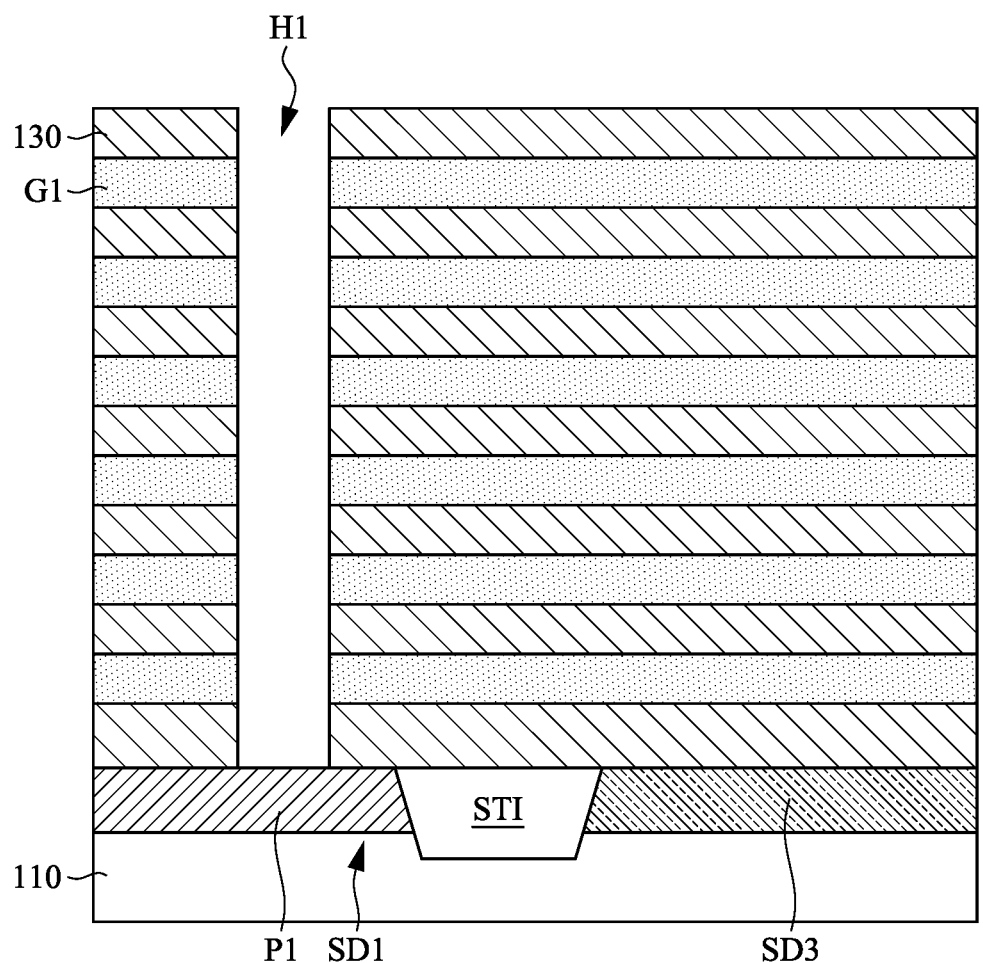
FIG. 6A to FIG. 6I are schematic cross-sectional views of intermediate stages of manufacturing a memory structure according to various embodiments of the present disclosure.

In operation 512, as shown in FIG. 6A, the first portion P1 of a first doping layer SD1 and a third doping layer SD3 are formed in the substrate 110. The first portion P1 of the first doping layer SD1 is electrically isolated from the third doping layer SD3 by the isolation structure STI embedded in the substrate 110. In some embodiments, the first portion P1 of the first doping layer SD1 and the third doping layer SD3 are respectively formed by doping a portion of the substrate 110. In operation 514, as shown in FIG. 6A, a plurality of insulating layers 130 and a plurality of first gate layers G1 alternately stacked are formed on the substrate 110. In operation 516, as shown in FIG. 6A, a first hole H1 is formed to penetrate through the insulating layers 130 and the first gate layers G1 to expose the first portion P1 of the first doping layer SD1. In some embodiments, the first hole H1 is formed by an etching process.

Figure 6B:
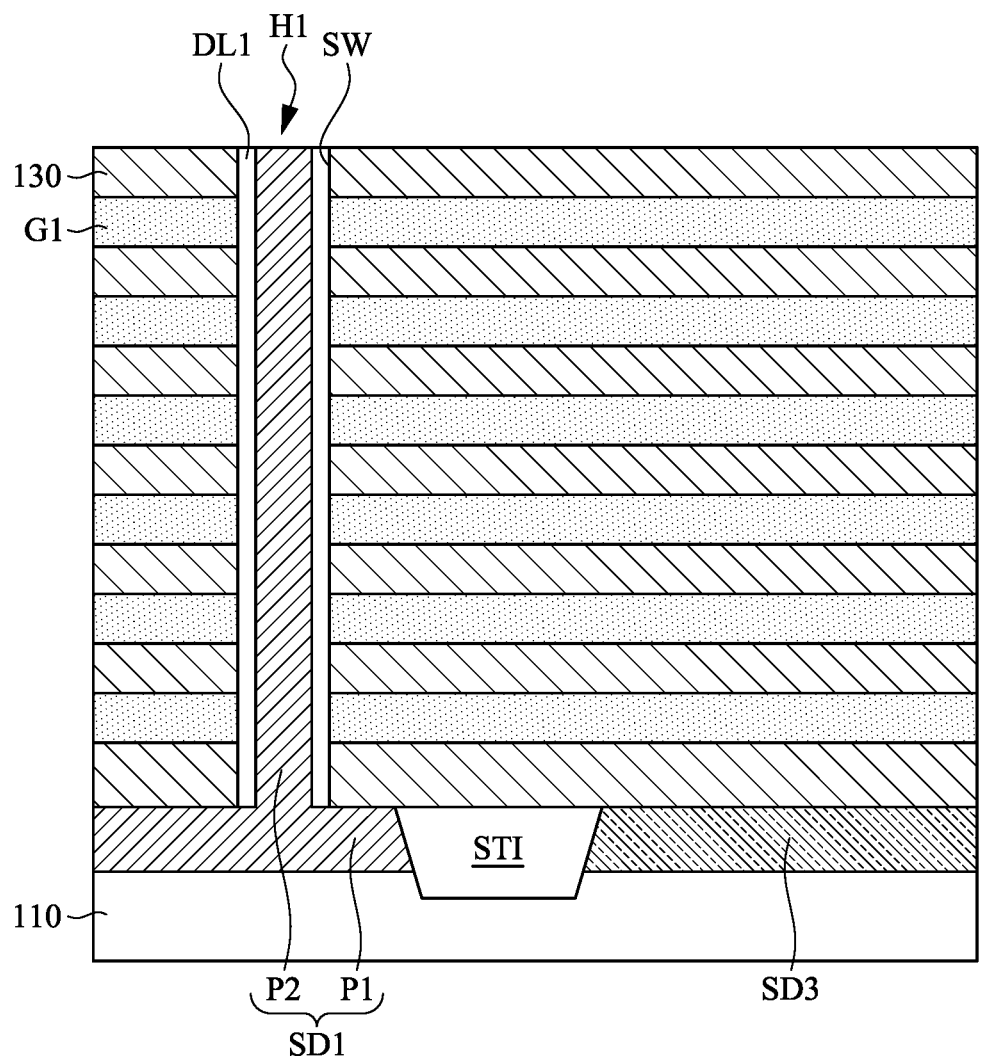

In operation 518, as shown in FIG. 6B, the first dielectric layer DL1 is formed to cover a sidewall SW of the first hole H1. In operation 520, as shown in FIG. 6B, the second portion P2 of the first doping layer SD1 is formed in the first hole H1. In some embodiments, the second portion P2 of the first doping layer SD1 is formed by a deposition process. In some embodiments, the first doping layer SD1 has a first conductive type, the third doping layer SD3 has a second conductive type, and the first conductive type is different from the second conductive type. In some embodiments, the first conductive type is N-type, and the second conductive type is P-type. In other embodiments, the first conductive type is P-type, and the second conductive type is N-type.

Figure 6C:
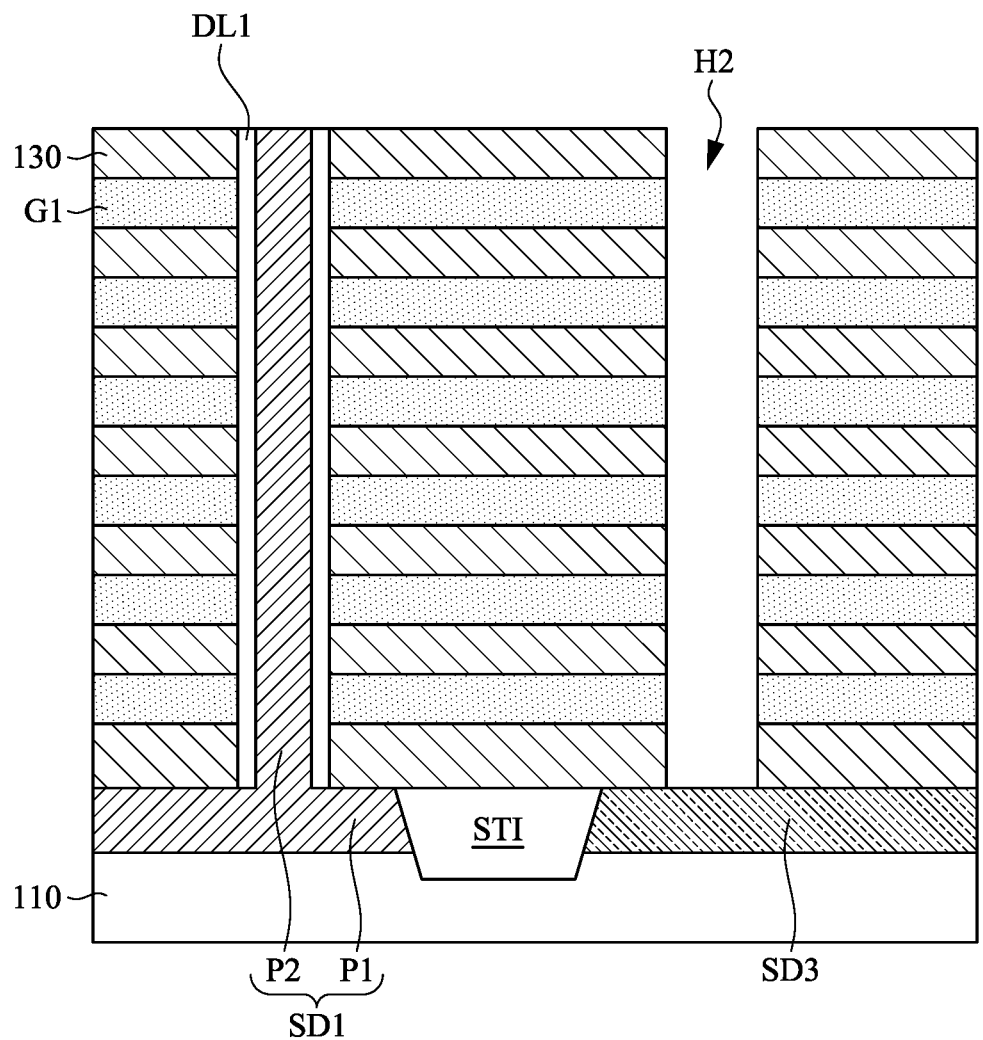
Figure 6D:
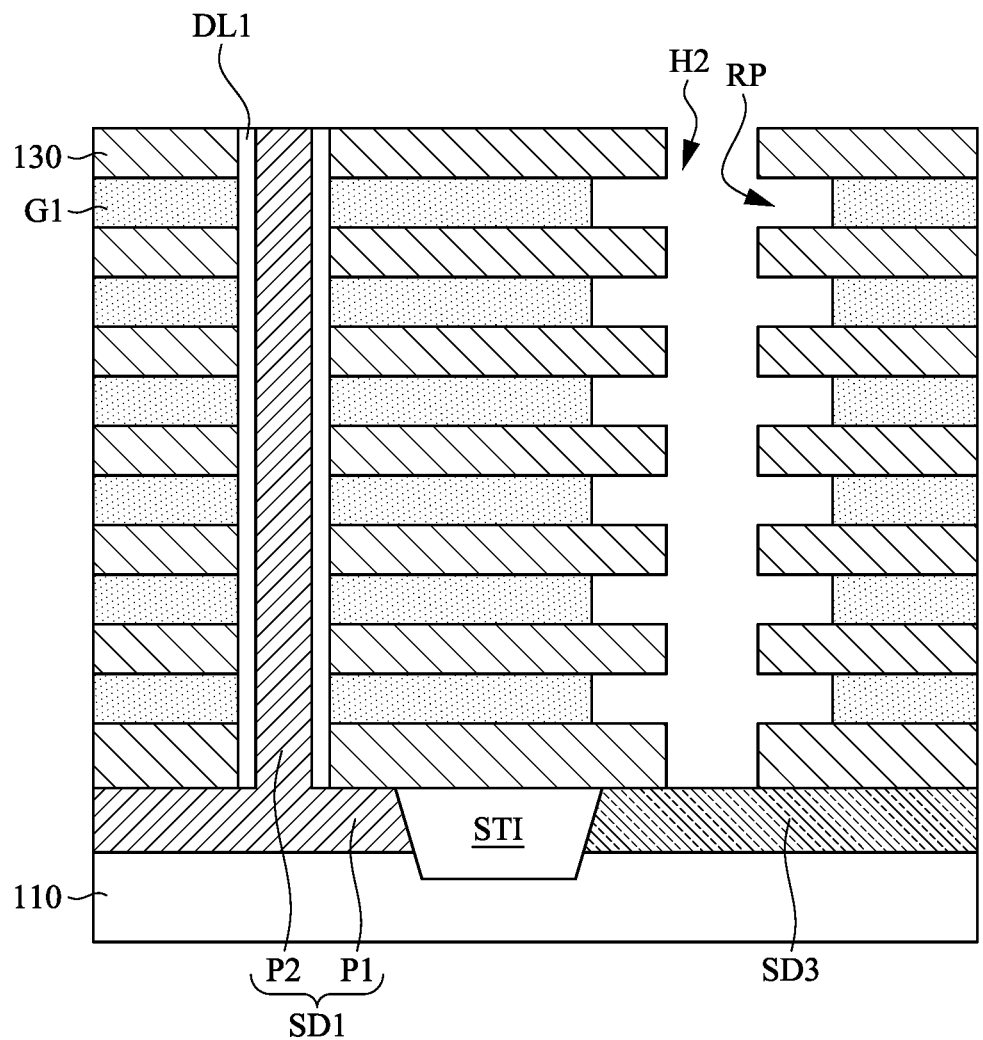

In operation 522, as shown in FIG. 6C, a second hole H2 is formed to penetrate the insulating layers 130 and the first gate layers G1. The second hole H2 exposes the third doping layer SD3. In some embodiments, the second hole H2 is formed by an etching process. In operation 524, as shown in FIG. 6D, the first gate layers G1 exposed from the second hole H2 are partially removed. After operation 524, the sidewall of the second hole H2 has a plurality of recess portions RP. In some embodiments, partially removing the first gate layers G1 is performed by a wet etching process.

Figure 6E:
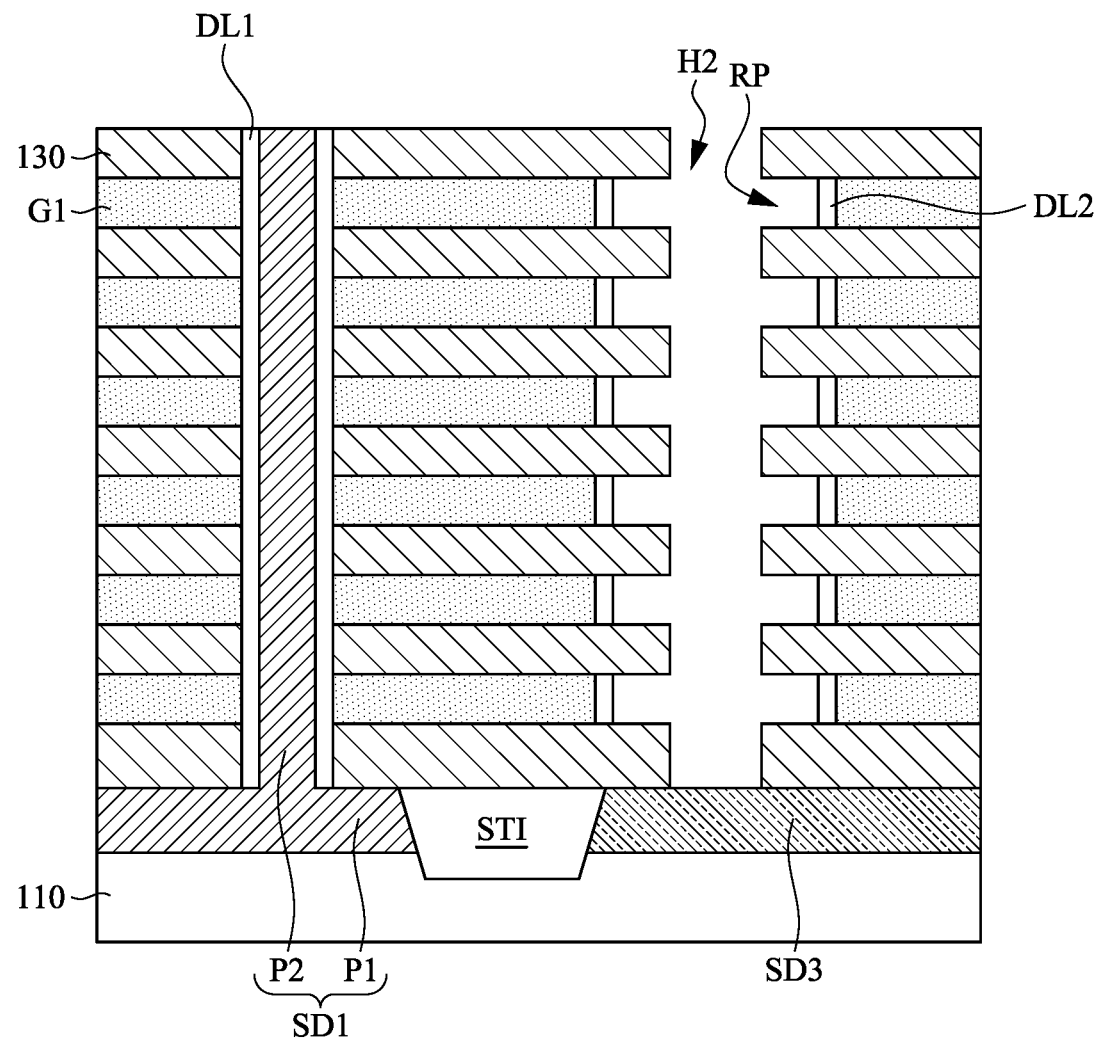
Figure 6F:
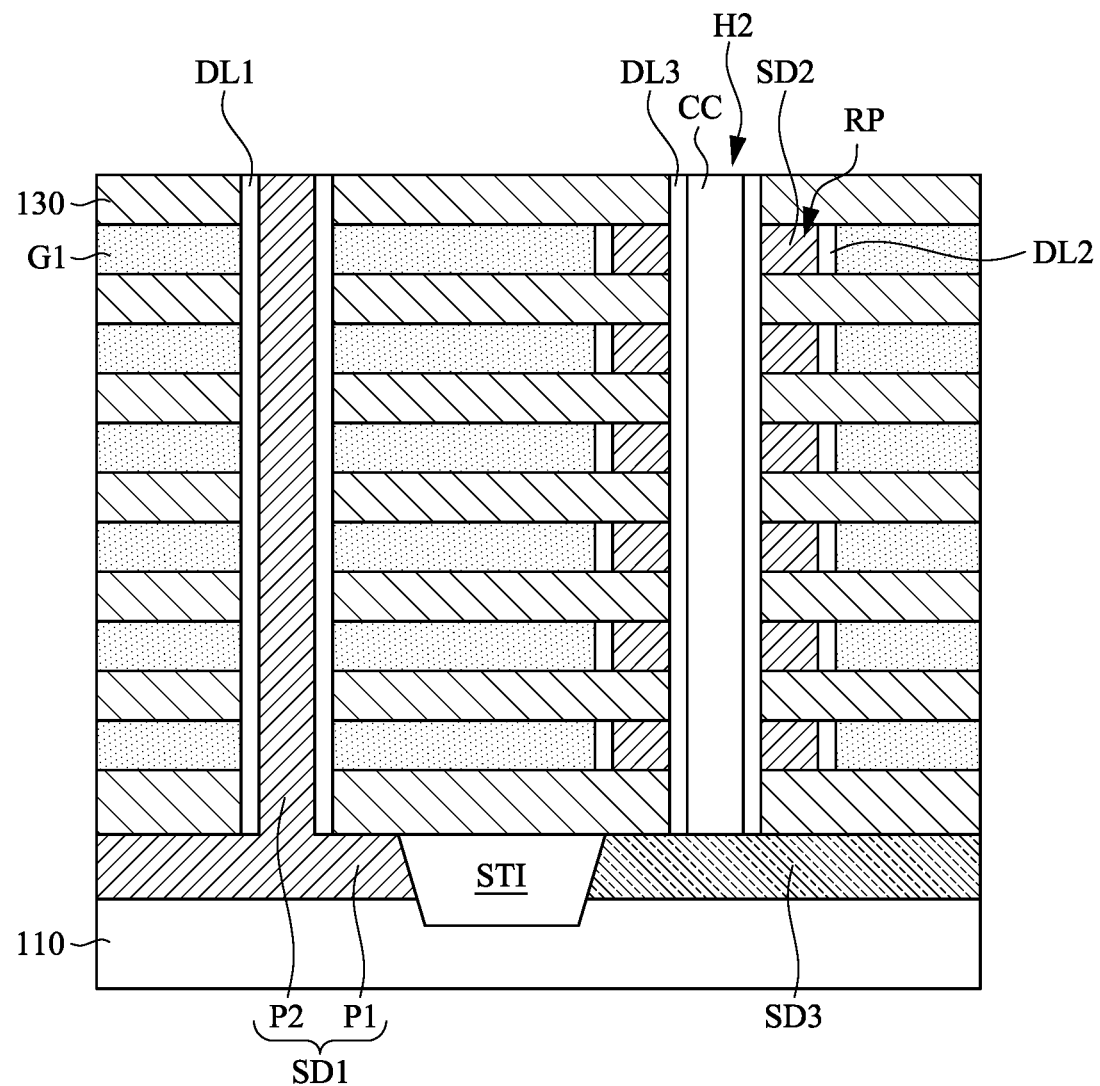

In operation 526, as shown in FIG. 6E, a plurality of second dielectric layers DL2 is formed in the recess portions RP to cover the first gate layers G1 that are partially removed. Specifically, the second dielectric layers DL2 are respectively formed in the recess portions RP and do not fill up the recess portions RP. In operation 528, as shown in FIG. 6F, the second doping layers SD2 are formed to cover the second dielectric layers DL2. Specifically, the second doping layers SD2 are respectively formed in the recess portions RP and fill up the recess portions RP. In operation 530, as shown in FIG. 6F, the third dielectric layer DL3 is formed in the second hole H2 to cover the insulating layers 130 and the second doping layers SD2. The third dielectric layer DL3 does not fill up the second hole H2. In operation 532, as shown in FIG. 6F, a columnar channel CC is formed in the second hole H2. The columnar channel CC fills up the second hole H2.

Figure 6G:
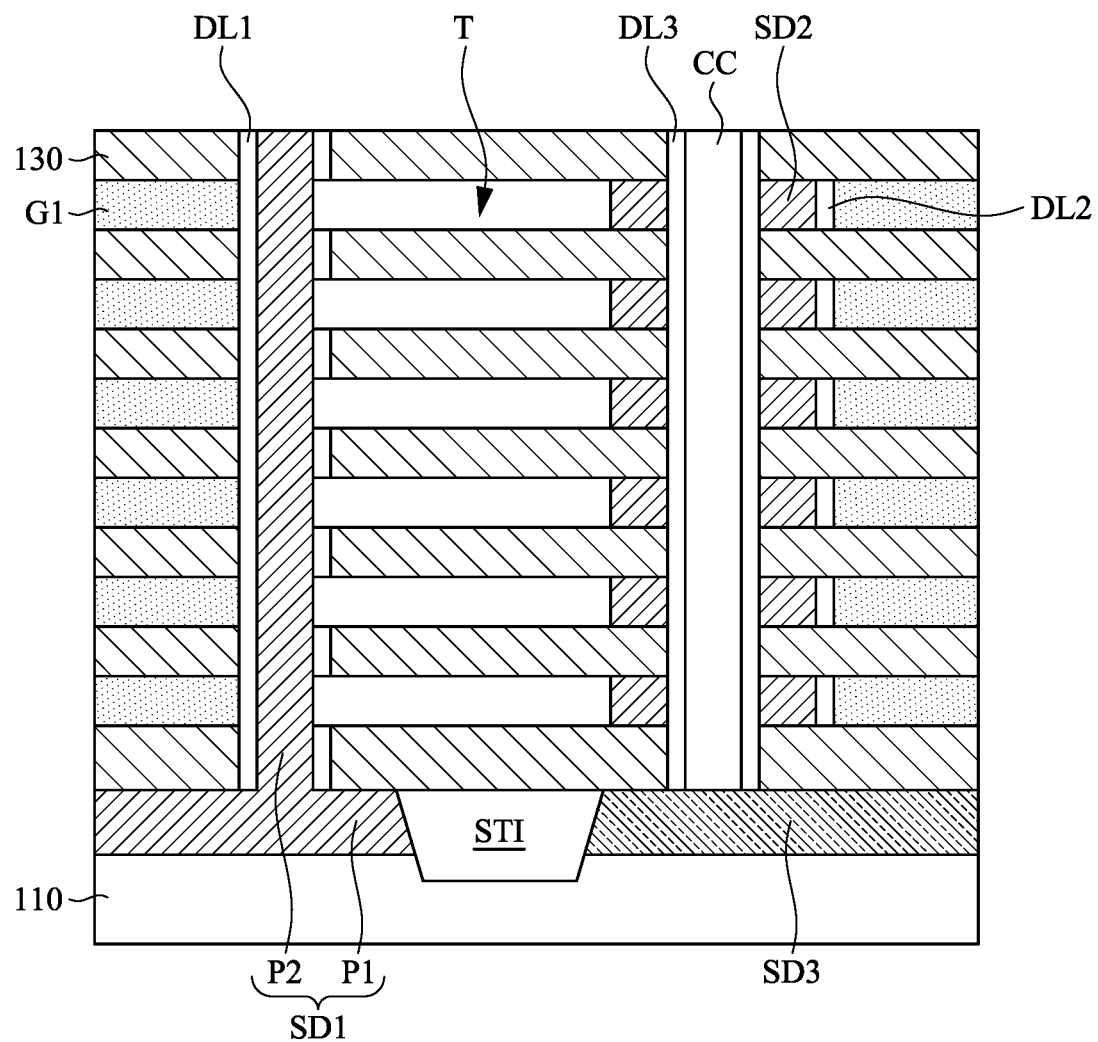
Figure 6H:
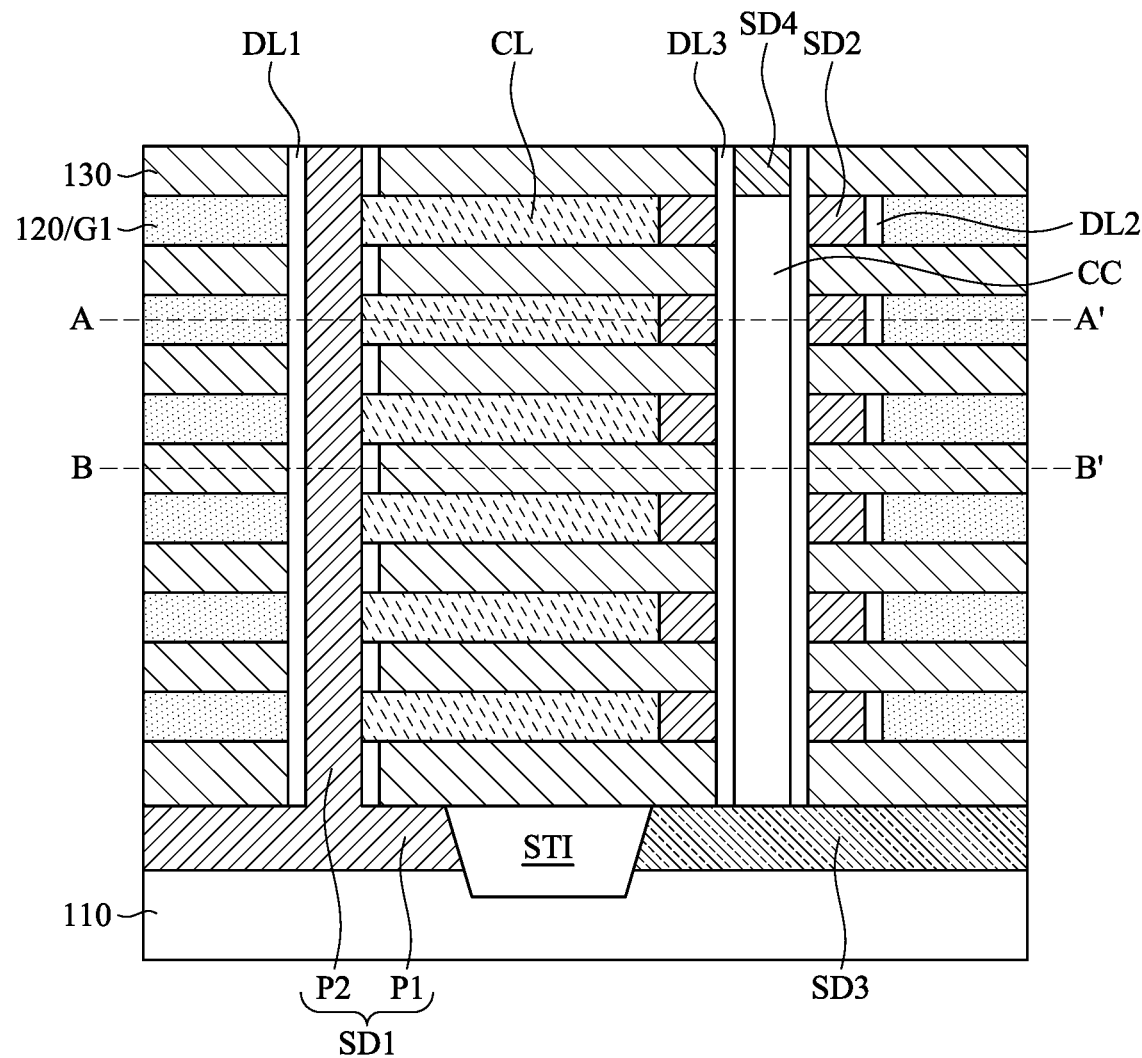

In operation 534, as shown in FIG. 6G, the first dielectric layer DL1, the first gate layers G1, and the second dielectric layers DL2 that are between the first doping layer SD1 and the second doping layers SD2 are removed to form a plurality of trenches T. Specifically, the portions of the first dielectric layer DL1, the portions of the first gate layers G1, and the portions of the second dielectric layers DL2 are removed to form the trenches T. In operation 536, as shown in FIG. 6H, a plurality of channel layers CL is formed in the trenches T to connect to the first doping layer SD1 and the second doping layers SD2. In some embodiments, the channel layers CL are formed by a deposition process. See FIG. 3 for the section along the section line A-A'. In some embodiments, as shown in FIG. 6F to FIG. 6H, operation 528, operation 530, operation 532, operation 534, and operation 536 are performed in sequence. After forming the columnar channel CC in the second hole H2, the channel layers CL are formed to connect to the first doping layer SD1 and the second doping layers SD2. In other embodiments, after forming the channel layers CL connected to first doping layer SD1 and second doping layers SD2, the columnar channel CC is formed in the second hole H2. In operation 538, as shown in FIG. 3, a plurality of fourth dielectric layers DL4 is formed adjacent to the channel layers CL. In operation 540, as shown in FIG. 3, a plurality of second gate layers G2 is formed adjacent to the fourth dielectric layers DL4. In operation 542, as shown in FIG. 6H, the top portion of the columnar channel CC is doped to form the fourth doping layer SD4.

Figure 6I:
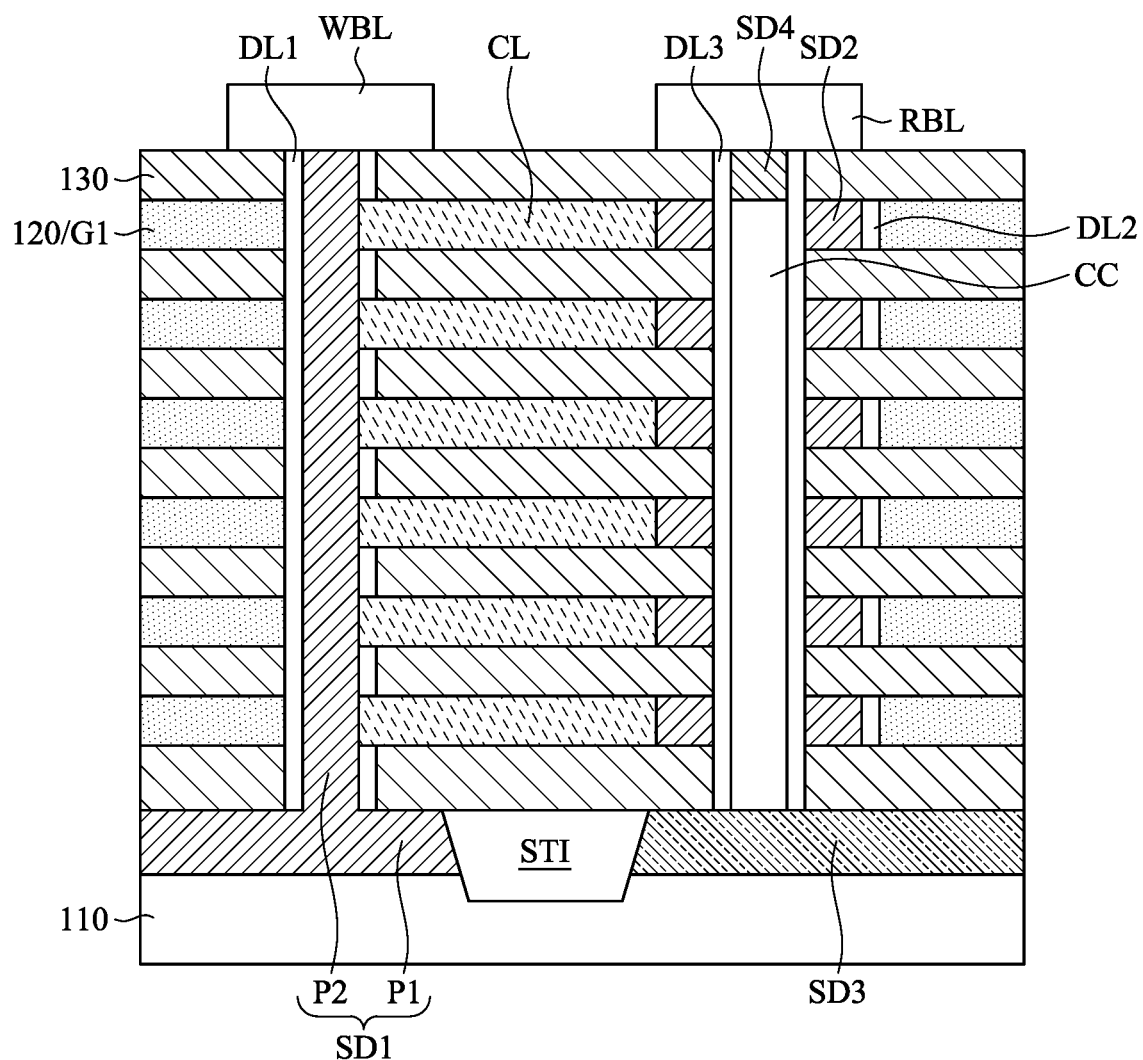

In operation 544, as shown in FIG. 6I, a write bit-line WBL is formed on the first doping layer SD1, and a read bit-line RBL is formed on the fourth doping layer SD4. Therefore, a memory structure 1400 is formed. The difference between the memory structure 1400 in FIG. 6I and the memory structure 100 in FIG. 2 is that the memory structure 1400 further includes the write bit-line WBL disposed on the first doping layer SD1 and the read bit-line RBL disposed on the fourth doping layer SD4.

Figure 7:
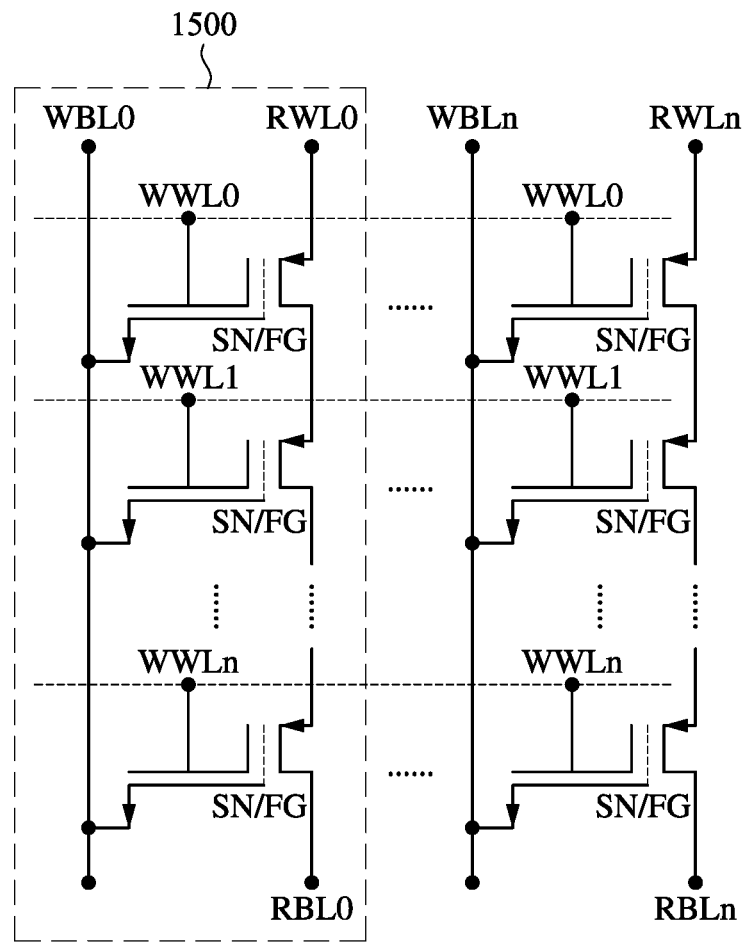
FIG. 7 is a schematic circuit diagram of a memory array according to various embodiments of the present disclosure.
Figure 8:
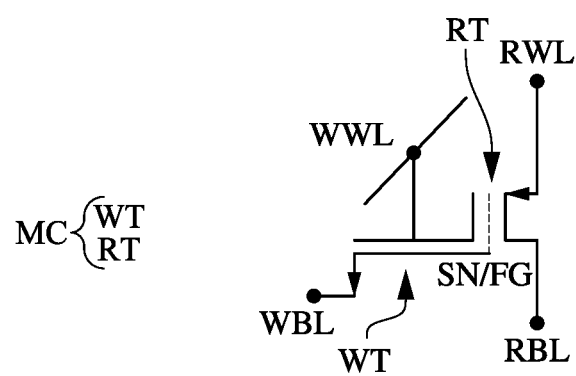
FIG. 8 is a schematic circuit diagram of a memory cell and its surrounding circuits according to various embodiments of the present disclosure.

The present disclosure provides an operating method of a memory structure, which includes the following operations. The memory structure of any one of the foregoing embodiments is received, such as the memory structure 1400, and a writing operation is performed. Please refer to FIG. 6I. In the memory structure 1400, the gate layers 120, the first doping layer SD1, the channel layers CL, and the second doping layers SD2 form a plurality of write transistors. In addition, the gate layers 120, the second doping layers SD2, the third doping layer SD3, the fourth doping layer SD4, and the columnar channel CC form a plurality of read transistors. FIG. 7 is a schematic circuit diagram of a memory array according to various embodiments of the present disclosure. The circuit 1500 is a schematic diagram of the equivalent circuit of the memory structure 1400. FIG. 8 is a schematic circuit diagram of a memory cell MC and its surrounding circuits according to various embodiments of the present disclosure. The memory cell MC includes a write transistor WT and a read transistor RT. It can be seen that the memory array in FIG. 7 includes multiple memory units.

Please refer to FIG. 7. The memory array includes a plurality of write word-lines (WWL), a plurality of write bit-lines (WBL), a plurality of read word-lines (RWL), and a plurality of read bit-lines (RBL). The write word-lines include the write word-lines WWL0, WWL1 ... WWLn. The write bit-lines include the write bit-lines WBL0 ... WBLn. The read word-lines include the read word-lines RWL0 ... RWLn. The read bit-lines include the read bit-lines RBL0 ... RBLn. The write word-lines are intersected with the write bit-lines. As shown in FIG. 6I, the read transistors are vertically interconnected, so the read word-line RWL0 and the read bit-line RBL0 are connected to the first and last read transistors in the circuit 1500.

Please refer to FIG. 6I and FIG. 8 at the same time. FIG. 8 shows a schematic diagram of an equivalent circuit of a memory cell in the memory structure 1400. The memory unit MC includes the write transistor WT and the read transistor RT. The write transistor WT is coupled to the write word-line WWL, and the first doping layer SD1 is coupled to the write bit-line WBL. One second doping layer SD2 serves as the storage node SN of the read transistor RT, and the storage node SN is also the floating gate FG. The read transistor RT is coupled to the read word-line RWL and the read bit-line RBL.

Please refer to FIG. 6I to FIG. 8 at the same time. The writing operation includes the following operations. The first voltage is applied to a selected gate of the gate layers 120 of the write transistors. The first voltage is greater than the threshold voltage of the selected gate. The gate layers 120 include the selected gate and unselected gates, in which the selected gate is a gate applied with the first voltage, and the unselected gates are gates without being applied with the first voltage. In other words, only the selected write word-line is applied with the first voltage, and other write word-lines are not applied with the first voltage. The first doping layer SD1 of the write transistors is applied a second voltage to charge or not charge one of the second doping layers SD2 corresponding to the selected gate, in which the second voltage is a positive voltage or 0V.

Figure 9:
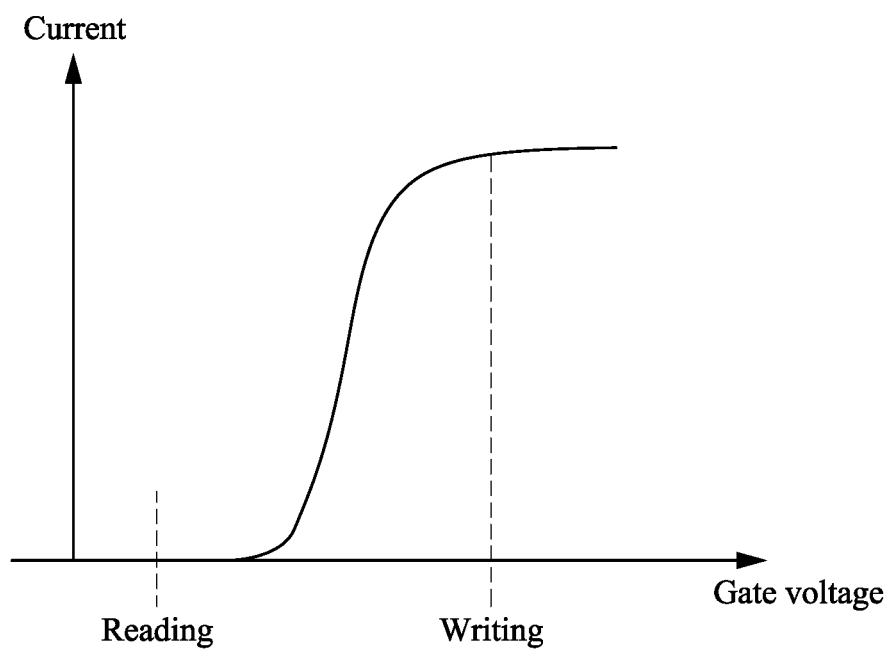
FIG. 9 is a current-voltage diagram of a write transistor according to various embodiments of the present disclosure.
Figure 10:
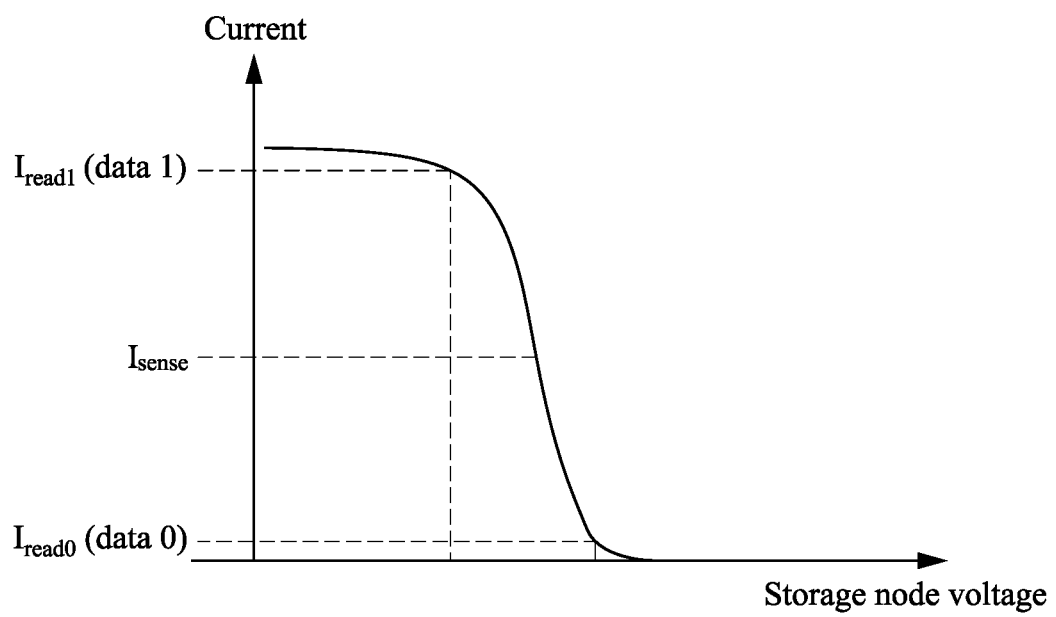
FIG. 10 is a current-voltage diagram of a read transistor according to various embodiments of the present disclosure.

Please refer to the memory unit MC in FIG. 8. The logic state of the memory cell MC depends on whether the storage node SN of the read transistor RT stores charges. In other words, the logic state depends on whether the storage node SN is at a high potential or a low potential. In some embodiments, the write transistor WT is a N-type transistor, and the read transistor RT is a P-type transistor. FIG. 9 is a current-voltage diagram of a write transistor according to various embodiments of the present disclosure, in which the write transistor is a N-type transistor. When performing a writing operation, the gate voltage is higher than the threshold voltage, and the write transistor WT is turned on. When performing a reading operation, the gate voltage is 0V or less than the threshold voltage, and the write transistor WT is turned off. FIG. 10 is a current-voltage diagram of a read transistor according to various embodiments of the present disclosure, in which the read transistor is a P-type transistor. The magnitude of the current depends on the voltage of the storage node SN of the read transistor RT. In FIG. 10, the current greater than $I_{sense}$ is $I_{read1}$, and $I_{read1}$ corresponds to data 1. The current less than $I_{sense}$ is $I_{read0}$, and $I_{read0}$ corresponds to data 0.

When it is desired to write data 0 to one P-type transistor, the first voltage is applied to one of the gate layers 120 of the N-type transistors, and the second voltage (positive voltage) is applied to the first doping layer SD1 of the N-type transistors. Therefore, the storage node SN (second doping layer SD2) of the P-type transistor is charged, so that the storage node SN is at a high potential. When the storage node SN of the P-type transistor is at a high potential, the P-type transistor is turned off. Therefore, during the reading operation, no current flows through the P-type transistor, or only a current less than $I_{sense}$ flows through the P-type transistor.

When it is desired to write data 1 to one P-type transistor, the first voltage is applied to one of the gate layers 120 of the N-type transistors, and the second voltage (0V) is applied to the first doping layer SD1 of the N-type transistors. Since the storage node SN (second doping layer SD2) of the P-type transistor is not charged, the storage node SN is at a low potential. When the storage node SN of the P-type transistor is at a low potential, the P-type transistor is turned on. Accordingly, the current of the P-type transistor will be measured during the reading operation, such as current greater than $I_{sense}$.

Please refer to FIG. 6I to FIG. 8 and FIG. 10 at the same time. In some embodiments, the operating method of the memory structure further includes: performing a reading operation. In the memory structure 1400, the write transistors are N-type transistors, and the read transistors are P-type transistors. The reading operation includes: applying a third voltage to the selected gate of the N-type transistors, and the third voltage is 0V or less than the threshold voltage of the selected gate. Therefore, the selected gate is turned off. A plurality of fourth voltages is applied to unselected gates of the gate layers 120 of the N-type transistors, and the fourth voltages are negative voltages, so that the unselected gates are turned off. The fifth voltage is applied to the third doping layer SD3 of the P-type transistors, and the fifth voltage is positive voltage, thereby measuring the current value of the P-type transistor. If the current value is higher than $I_{sense}$, it can be known that the P-type transistor stores data 1. If the current value is lower than $I_{sense}$, it can be known that the P-type transistor stores data 0.

Next, the operating method of the memory structure is illustratively explained with an embodiment. Please refer to FIG. 6I, FIG. 7, and Table 1 below at the same time. In the memory array, the write transistors are N-type transistors, and the read transistors are P-type transistors. When data 0 is written, the selected write word-line and the write bit-line are respectively applied with a voltage of 3V, and no voltage is applied to the unselected write word-lines, the read word-line, and the read bit-line. When data 1 is written, the selected write word-line is applied with a gate voltage of 3V, and no voltage is applied to the unselected write word-lines, the write bit-line, the read word-line, and the read bit-line. When reading, no voltage is applied to the selected write word-line, so that the write transistor coupled to the selected write word-line is turned off. The unselected write word-lines are applied with negative voltages to achieve the following two purposes. The purpose (1) is to turn off the write transistors coupled with the unselected write word-lines. The purpose (2) is as follows. From FIG. 6I, it can be seen that the read transistors on the right side are adjacent to the gate layers 120, so they are also controlled by the negative voltages. Since the read transistors are P-type transistors, the channels of the read transistors are turned on, thereby allowing the current to flow. In addition, when reading, a voltage of 1V is applied to the read word-line, and the magnitude of the current depends on the voltage of the storage node of the read transistor.

TABLE 1

|  | Writing data 0 | Writing data 1 | Reading |
|---|---|---|---|
| Selected write word-line | 3 V | 3 V | 0 V |
| Unselected write word-lines | 0 V | 0 V | −3 V |
| Write bit-line | 3 V | 0 V | 0 V |
| Read word-line | 0 V | 0 V | 1 V |
| Read bit-line | 0 V | 0 V | 0 V |

Please refer to FIG. 6I to FIG. 8 and FIG. 10 at the same time. In other embodiments, the write transistors are P-type transistors, and the read transistors are N-type transistors. The operation principle of this embodiment can be deduced by referring to the principles of the foregoing embodiments (write transistor are N-type transistors, and read transistors are P-type transistors), and will not be repeated here. In some embodiments, the operating method of the memory structure further includes: performing a reading operation. The reading operation includes: applying a third voltage to the selected gate of the P-type transistors, and the third voltage is 0 V or less than the threshold voltage of the selected gate. Therefore, the selected gate is turned off. A plurality of fourth voltages is applied to unselected gates of the gate layers 120 of the P-type transistors. The fourth voltages are positive voltages, and therefore the unselected gates are turned off. A fifth voltage is applied to the third doping layer SD3 of the N-type transistors, and the fifth voltage is positive voltage, thereby measuring the current value of the N-type transistor.

According to the above, the present disclosure provides a memory structure, its manufacturing method, and its operating method. In the memory structure, the read transistors are vertically interconnected, so the density of the memory units can be increased, which is beneficial to the size reduction of the memory structure. Moreover, the manufacturing method of the present disclosure has a simple process, so the manufacturing cost can be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A memory structure, comprising:
   a plurality of insulating layers and a plurality of gate layers that are alternately stacked;
   a first doping layer penetrating through the insulating layers and the gate layers;
   a plurality of channel layers respectively connected to the first doping layer, wherein the channel layers and the insulating layers are alternately stacked;
   a columnar channel penetrating through the insulating layers and the gate layers;
   a plurality of second doping layers respectively surrounding the columnar channel, wherein the second doping layers are respectively connected to the channel layers;
   a third doping layer coupled to the columnar channel;
   a fourth doping layer coupled to the columnar channel;
   a first dielectric layer disposed between the first doping layer and the gate layers;
   a plurality of second dielectric layers respectively disposed between the second doping layers and the gate layers;
   a third dielectric layer disposed between the columnar channel and the second doping layers; and
   a plurality of fourth dielectric layers respectively disposed between the channel layers and the gate layers.

2. The memory structure of claim 1, further comprising a write bit-line disposed on the first doping layer.

3. The memory structure of claim 1, wherein the third doping layer is disposed under the columnar channel, and the fourth doping layer is disposed on the columnar channel.

4. The memory structure of claim 3, further comprising a read bit-line disposed on the fourth doping layer.

5. The memory structure of claim 1, wherein the first doping layer and the second doping layers have a first conductive type, the third doping layer and the fourth doping layer have a second conductive type, and the first conductive type is different from the second conductive type.

6. The memory structure of claim 5, wherein the first conductive type is N-type, and the second conductive type is P-type.

7. The memory structure of claim 5, wherein the first conductive type is P-type, and the second conductive type is N-type.

8. The memory structure of claim 5, wherein the channel layers have the second conductive type, and the columnar channel has the first conductive type.

9. The memory structure of claim 8, wherein the first conductive type is N-type, and the second conductive type is P-type.

10. The memory structure of claim 1, wherein the channel layers and the columnar channel are undoped.

11. A manufacturing method of a memory structure, comprising:
   forming a first hole penetrating through a plurality of insulating layers and a plurality of first gate layers that are alternately stacked;
   forming a first dielectric layer to cover a sidewall of the first hole;
   forming a first doping layer in the first hole;
   forming a second hole penetrating through the insulating layers and the first gate layers;
   partially removing the first gate layers exposed from the second hole to form a plurality of recess portions;
   forming a plurality of second dielectric layers in the recess portions;
   forming a plurality of second doping layers to cover the second dielectric layers;
   forming a third dielectric layer in the second hole to cover the insulating layers and the second doping layers;
   forming a columnar channel in the second hole;

removing the first dielectric layer, the first gate layers, and the second dielectric layers between the first doping layer and the second doping layers to form a plurality of trenches; and forming a plurality of channel layers in the trenches to connect to the first doping layer and the second doping layers.

12. The manufacturing method of the memory structure of claim 11, wherein after forming the columnar channel in the second hole, the channel layers are formed to connect to the first doping layer and the second doping layers.

13. The manufacturing method of the memory structure of claim 11, further comprising:

after forming the channel layers in the trenches, forming a plurality of fourth dielectric layers adjacent to the channel layers; and forming a plurality of second gate layers adjacent to the fourth dielectric layers.

14. The manufacturing method of the memory structure of claim 11, further comprising:

before forming the second hole penetrating through the insulating layers and the first gate layers, forming a third doping layer in a substrate, and forming the insulating layers and the first gate layers on the substrate, wherein the second hole exposes the third doping layer; and doping a top portion of the columnar channel to form a fourth doping layer.

15. The manufacturing method of the memory structure of claim 14, further comprising:

forming a write bit-line on the first doping layer; and forming a read bit-line on the fourth doping layer.

16. An operating method of a memory structure, comprising:

receiving the memory structure of claim 1, wherein the gate layers, the first doping layer, the channel layers, and the second doping layers form a plurality of write transistors, and the gate layers, the second doping layers, the third doping layer, the fourth doping layer, and the columnar channel form a plurality of read transistors; and performing a writing operation, the writing operation comprising:

applying a first voltage to a selected gate of the gate layers of the write transistors, wherein the first voltage is greater than a threshold voltage of the selected gate; and applying a second voltage to the first doping layer of the write transistors to charge or not charge one of the second doping layers corresponding to the selected gate, wherein the second voltage is a positive voltage or 0V.

17. The operating method of the memory structure of claim 16, wherein the write transistors are N-type transistors, and the read transistors are P-type transistors.

18. The operating method of the memory structure of claim 17, further comprising:

performing a reading operation, the reading operation comprising:

applying a third voltage to the selected gate, wherein the third voltage is 0V or less than the threshold voltage of the selected gate;

applying a plurality of fourth voltages to unselected gates of the gate layers of the write transistors, wherein the fourth voltages are negative voltages; and applying a fifth voltage to the third doping layer, wherein the fifth voltage is a positive voltage.

19. The operating method of the memory structure of claim 16, wherein the write transistors are P-type transistors, and the read transistors are N-type transistors.

20. The operating method of the memory structure of claim 19, further comprising:

performing a reading operation, the reading operation comprising:

applying a third voltage to the selected gate, wherein the third voltage is 0V or less than the threshold voltage of the selected gate;

applying a plurality of fourth voltages to unselected gates of the gate layers of the write transistors, wherein the fourth voltages are positive voltages; and applying a fifth voltage to the third doping layer, wherein the fifth voltage is a positive voltage.

* * * * *